United States Patent
Tsuda

(10) Patent No.: US 9,444,427 B2
(45) Date of Patent: Sep. 13, 2016

(54) SURFACE ACOUSTIC WAVE DEVICE INCLUDING FIRST AND SECOND WIRING ELECTRODES CROSSING THREE-DIMENSIONALLY

(71) Applicant: Murata Manufacturing Co., Ltd., Nagaokakyo-shi, Kyoto-fu (JP)

(72) Inventor: Motoji Tsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/882,511

(22) Filed: Oct. 14, 2015

(65) Prior Publication Data

US 2016/0036410 A1    Feb. 4, 2016

Related U.S. Application Data

(63) Continuation of application No. PCT/JP2014/060204, filed on Apr. 8, 2014.

(30) Foreign Application Priority Data

Apr. 18, 2013 (JP) .................................. 2013-087104
Dec. 11, 2013 (WO) .................. PCT/JP2013/083187

(51) Int. Cl.
*H03H 9/10*    (2006.01)
*H03H 9/64*    (2006.01)
(Continued)

(52) U.S. Cl.
CPC ..... *H03H 9/02992* (2013.01); *H03H 9/02984* (2013.01); *H03H 9/058* (2013.01);
(Continued)

(58) Field of Classification Search
CPC ..................... H03H 9/02984; H03H 9/02992; H03H 9/058; H03H 9/1071; H03H 9/145; H03H 9/14541; H03H 9/14547; H03H 9/25; H03H 9/64; H03H 9/02897; H03H 9/02905; H03H 9/02937; H03H 9/1092
USPC .................. 333/193, 195; 310/313 B, 313 D
See application file for complete search history.

(56) References Cited

U.S. PATENT DOCUMENTS

2010/0327694 A1    12/2010    Omote et al.
2011/0102108 A1    5/2011    Fukuda
(Continued)

FOREIGN PATENT DOCUMENTS

JP    2003-152498 A    5/2003
JP    2008-047955 A  * 2/2008
(Continued)

OTHER PUBLICATIONS

English language machine translation of JP 2011-160024, published on Aug. 18, 2011, 9 pages.*
(Continued)

*Primary Examiner* — Barbara Summons
(74) *Attorney, Agent, or Firm* — Keating & Bennett, LLP

(57) ABSTRACT

A surface acoustic wave device includes, on a substrate, functional electrode units each including at least one IDT electrode, wiring electrodes connected to the functional electrode units, insulation films provided between the wiring electrode and the substrate, and a support member that surrounds the functional electrode units and at least a portion of the wiring electrodes. A thickness of the support member is larger than a thickness of the insulation films, and the insulation films and the support member are made of the same material.

19 Claims, 6 Drawing Sheets

(51) Int. Cl.
  *H03H 9/02*    (2006.01)
  *H03H 9/05*    (2006.01)
  *H03H 9/145*    (2006.01)
  *H03H 9/25*    (2006.01)

(52) U.S. Cl.
  CPC .......... *H03H 9/1092* (2013.01); *H03H 9/145* (2013.01); *H03H 9/14541* (2013.01); *H03H 9/25* (2013.01); *H03H 9/64* (2013.01); *H03H 9/1071* (2013.01); *H03H 9/14547* (2013.01)

(56) References Cited

U.S. PATENT DOCUMENTS

| | | | |
|---|---|---|---|
| 2012/0279795 A1* | 11/2012 | Furukawa | H03H 9/02937 181/139 |
| 2012/0319802 A1 | 12/2012 | Ochiai et al. | |

FOREIGN PATENT DOCUMENTS

| | | | |
|---|---|---|---|
| JP | 2009-117730 A | | 5/2009 |
| JP | 2011-077601 A | | 4/2011 |
| JP | 2011-160024 A | * | 8/2011 |
| JP | 2011-172190 A | | 9/2011 |
| JP | 2012-029134 A | | 2/2012 |
| WO | 2009/116222 A1 | | 9/2009 |
| WO | 2009/150786 A1 | | 12/2009 |
| WO | 2011/087018 A1 | | 7/2011 |

OTHER PUBLICATIONS

English language machine translation of JP 2008-047955, published on Feb. 28, 2008, 14 pages.*
Official Communication issued in International Patent Application No. PCT/JP2013/083187, mailed on Jan. 28, 2014.
Official Communication issued in International Patent Application No. PCT/JP2014/060204, mailed on Jun. 17, 2014.

* cited by examiner

SURFACE ACOUSTIC WAVE DEVICE INCLUDING FIRST AND SECOND WIRING ELECTRODES CROSSING THREE-DIMENSIONALLY

BACKGROUND OF THE INVENTION

1. Field of the Invention

The present invention relates to surface acoustic wave devices each including a substrate, a support member, and a cover member and in which a hollow space is provided.

2. Description of the Related Art

Surface acoustic wave devices such as a resonator, a bandpass filter, and the like have been widely used. In order to miniaturize surface acoustic wave devices, a wafer level packaging technique has been making substantial progress these days. For example, Japanese Unexamined Patent Application Publication No. 2011-172190 discloses a surface acoustic wave device using the wafer level packaging technique.

In the surface acoustic wave device disclosed in Japanese Unexamined Patent Application Publication No. 2011-172190, an interdigital transducer (IDT) electrode and a wiring electrode are formed on a piezoelectric substrate. A support member is formed on the piezoelectric substrate so as to surround the IDT electrode, the wiring electrode, and the like. Further, an upper opening of the support member is sealed with a lid member, whereby a sealed hollow space is provided in the device. In order to miniaturize the device, a three-dimensional crossing section where one wire and the other wire cross each other via an insulation film is provided in the wiring electrode. Japanese Unexamined Patent Application Publication No. 2011-172190 discloses that the insulation film of the three-dimensional crossing section is formed of polyimide. Meanwhile, the support member is formed of a resin which is different from polyimide.

International Publication No. WO/2009/116222 and International Publication No. WO/2011/087018 each disclose a surface acoustic wave device such that a material forming an insulation film that is provided in a three-dimensional crossing section of a wiring electrode and a material forming a support member are different from each other. In addition, a structure such that the support member is not disposed above the three-dimensional crossing section is disclosed.

The following may be a reason why an insulation film used in a three-dimensional crossing section and an insulation film used in a support member are formed of different resins from each other in the conventional devices.

A thickness of the insulation film in the three-dimensional crossing section is approximately 1 μm to 3 μm in general. Meanwhile, to form a hollow space structure, a thickness of the support member is relatively large to be no less than 10 μm. As such, it has been thought to be difficult to form the insulation film and the support member using the same material in the same process because the thicknesses thereof are considerably different. Accordingly, the manufacturing process of the device has been complicated, the cost thereof has been raised, and so on.

SUMMARY OF THE INVENTION

Preferred embodiments of the present invention provide a surface acoustic wave device that includes an insulation film and a support member, and that is capable of simplifying a manufacturing process thereof and realizing cost reduction.

A surface acoustic wave device according to an aspect of various preferred embodiments of the present invention includes a substrate, a functional electrode unit, a wiring electrode, an insulation film, a support member, and a cover member. The functional electrode unit is located on the substrate and includes at least one IDT electrode. The wiring electrode is connected to the functional electrode unit and is located on the substrate.

The insulation film is provided between a portion of the wiring electrode and the substrate. The support member is provided on the substrate and surrounds the functional electrode unit and at least a portion of the wiring electrode. The cover member, along with the support member, defines a hollow space in which the functional electrode unit is located.

In a preferred embodiment of the present invention, a thickness of the support member is larger than a thickness of the insulation film, and the insulation film and the support member are made of the same material.

In a surface acoustic wave device according to a specific aspect of various preferred embodiments of the present invention, the wiring electrode includes a first wiring electrode and a second wiring electrode, there exists a three-dimensional crossing section where the first wiring electrode and the second wiring electrode cross each other in a three-dimensional manner, the support member is present above at least a portion of the second wiring electrode in the three-dimensional crossing section, the insulation film is located under the second wiring electrode in the three-dimensional crossing section, and the first wiring electrode is located under the insulation film.

In a surface acoustic wave device according to another specific aspect of various preferred embodiments of the present invention, the three-dimensional crossing section is provided at the inside of the support member.

In a surface acoustic wave device according to another specific aspect of various preferred embodiments of the present invention, a laminated portion where the wiring electrode and the insulation film are layered is provided at the inside of the support member when the substrate is viewed from above.

In a surface acoustic wave device according to another specific aspect of various preferred embodiments of the present invention, in the three-dimensional crossing section provided at the inside of the support member, the wiring electrode includes a portion where width thereof is smaller than the width of the other portion of the wiring electrode inside the three-dimensional crossing section.

In a surface acoustic wave device according to another specific aspect of various preferred embodiments of the present invention, in the laminated portion provided at the inside of the support member, the wiring electrode includes a portion where the width thereof is smaller than the width of the other portion of the wiring electrode inside the laminated portion.

In a surface acoustic wave device according to an aspect of various preferred embodiments of the present invention, it is preferable for the insulation film and the support member to be made of synthetic resin.

In a surface acoustic wave device according to an aspect of various preferred embodiments of the present invention, it is more preferable for the above-mentioned synthetic resin to be a cured light curing polyimide.

In a surface acoustic wave device according to an aspect of various preferred embodiments of the present invention, it is more preferable for the synthetic resin to be a cured thermosetting polyimide.

In a surface acoustic wave device according to an aspect of various preferred embodiments of the present invention, the IDT electrode may include an AlCu epitaxial film.

In a surface acoustic wave device according to various preferred embodiments of the present invention, because the support member and the insulation film are made of the same material, the support member and the insulation film can be formed in the same process. This makes it possible to simplify the manufacturing process of the device and realize cost reduction thereof.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1B is an enlarged cross-sectional view of a portion taken along a line B-B shown in FIG. 1A.

DETAILED DESCRIPTION OF THE PREFERRED EMBODIMENTS

Hereinafter, the present invention will be clarified through describing specific preferred embodiments of the present invention with reference to the drawings.

With reference to FIGS. 1A and 1B through FIG. 5, a manufacturing method for and a structure of a surface acoustic wave device according to a first preferred embodiment of the present invention will be specifically described. In manufacturing the surface acoustic wave device of the present invention, a piezoelectric substrate that defines and functions as a substrate is prepared first. In the present preferred embodiment, a LiTaO$_3$ substrate is preferably used as the piezoelectric substrate. However, a piezoelectric substrate formed of another piezoelectric material may be used. Note that the piezoelectric substrate also includes a structure in which a thin film made of piezoelectric material is formed on a principal surface of a carrier made of non-piezoelectric material.

Figure 1A:
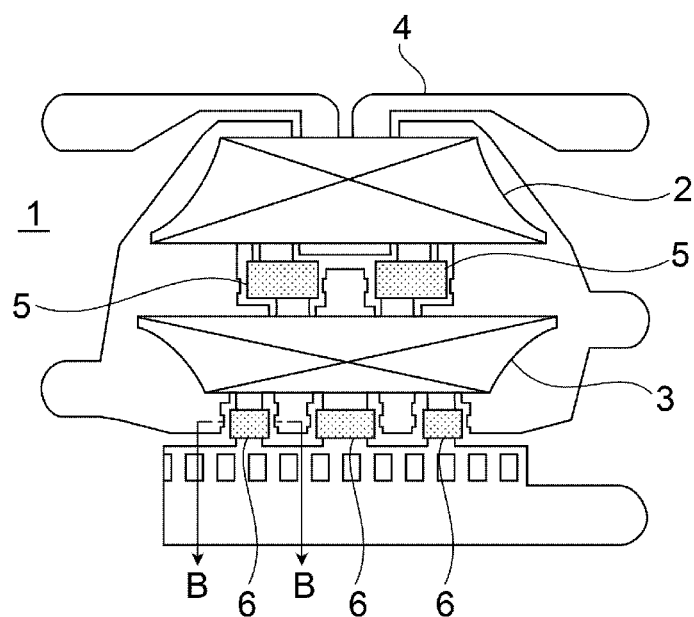
FIG. 1A and FIG. 1B are a schematic plan view illustrating a state in which a functional electrode unit, a wiring electrode, and an insulation film laminated on a portion of the wiring electrode are formed on a substrate, in a manufacturing method for a surface acoustic wave device according to a first preferred embodiment of the present invention.

As shown in FIG. 1A, functional electrode units 2 and 3 each including an IDT electrode are formed on a principal surface of the piezoelectric substrate 1. FIG. 1A illustrates only the positions of the functional electrode units 2 and 3 in a schematic manner. In actuality, in the present preferred embodiment, the functional electrode unit 2 includes an IDT electrode and reflector electrodes that are disposed on both sides of the IDT electrode provided along a propagation direction of an elastic wave. The functional electrode unit 3 preferably has the same configuration as the functional electrode unit 2. In the present preferred embodiment, by electrically connecting the functional electrode units 2 and 3 together, a balance-type surface acoustic wave filter is configured.

In various preferred embodiments of the present invention, the functional electrode unit refers to an electrode unit that excites a surface acoustic wave and obtains electric characteristics based on the excited surface acoustic wave. The electric characteristics obtained in the functional electrode unit and a mode of the electrode are not intended to be limited to any specific ones; the functional electrode unit may define an unbalance-type surface acoustic wave filter and it is sufficient for the functional electrode unit to include at least one IDT electrode. In FIG. 1, a plurality of the functional electrode units 2 and 3 are connected in a two-stage cascading connection by a pair of inter-stage wires so as to define a longitudinally coupled resonator-type surface acoustic wave filter. Note that the functional electrode units are not intended to be limited to a configuration in which the functional electrode units are connected in a two-stage cascading connection so as to define a longitudinally coupled resonator-type surface acoustic wave filter. For example, the functional electrode units may define a ladder-type surface acoustic wave filter.

A first wiring electrode 4 is formed at the same time as the formation of the functional electrode units 2 and 3. The first wiring electrode 4 is electrically connected to the IDT electrodes of the functional electrode units 2 and 3. The first wiring electrode 4 and the functional electrode units 2 and 3 can be formed of appropriate metals. In the present preferred embodiment, a plurality of metal films are sequentially deposited and patterned to form a laminated metal film. In other words, the functional electrode units 2, 3 and the first wiring electrode 4 are each formed with the laminated metal film.

The metal materials are not intended to be limited to any specific ones; appropriate metals such as Cu, Al, Ag, Pt, W, and the like or alloys containing these metals as main components can be used. In the present preferred embodiment, one metal layer in the laminated metal film preferably is formed of an AlCu epitaxial film. In the AlCu epitaxial film, orientation is improved by forming a Ti film in a layer under the AlCu layer. Note that an Al epitaxial film not containing Cu can be used as well.

Figure 1B:
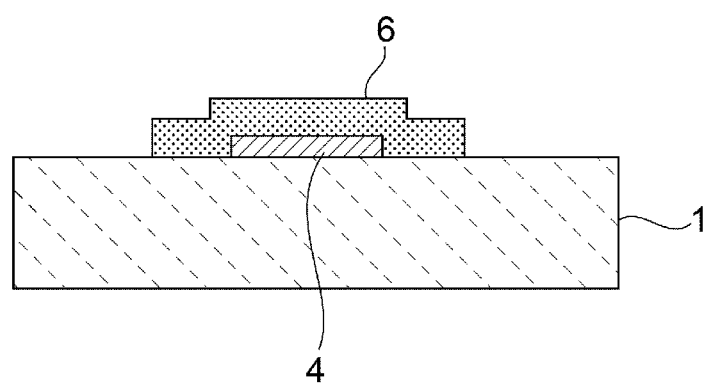

Next, insulation films 5 and 6, as shown in FIG. 1A, are formed. In the present preferred embodiment, the insulation films 5 and 6 are formed so as to provide a three-dimensional crossing section of the wiring electrode. As shown in FIG. 1B, the first wiring electrode 4 is located at the lower side of the insulation film 6 in the three-dimensional crossing section.

In the present preferred embodiment, the insulation films 5 and 6 preferably are each formed of a cured light curing polyimide. That is, light curing polyimide is applied, patterned by a photolithography technique, and cured, such that the insulation films 5 and 6 can be formed. In the case of using light curing polyimide, heating is not needed for curing. Accordingly, metals defining the functional electrode units 2 and 3, the first wiring electrode 4 are unlikely to be damaged.

The insulation films 5 and 6 may not be formed of light curing polyimide, but formed of thermosetting polyimide. In this case, it is sufficient to carry out heating after the thermosetting polyimide is applied and patterned.

The insulation films 5 and 6 may be formed of synthetic resin other than polyimide. In other words, an appropriate thermosetting, light curing, or thermoplastic resin, other than polyimide, may be used. It is preferable to use the light curing resin because heating is not needed.

Figure 2A:
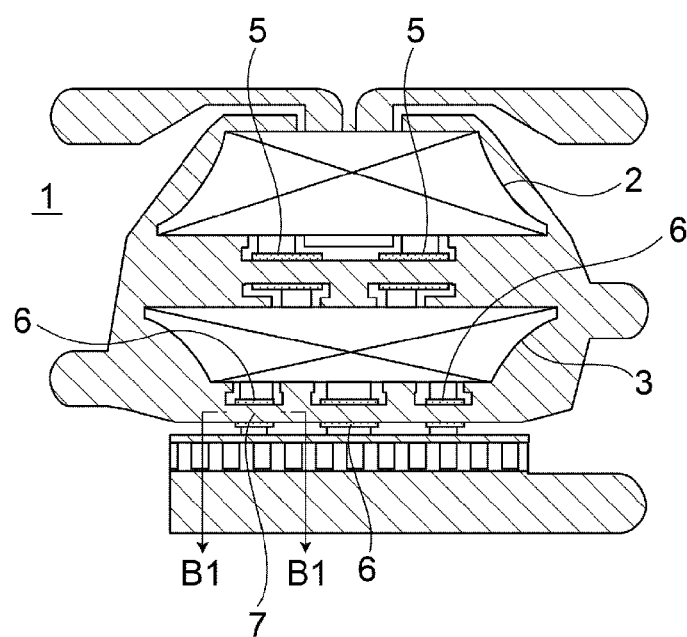
FIG. 2A is a plan view illustrating a state in which a wiring electrode is formed on an insulation film in a structure shown in FIG. 1A.
Figure 2B:
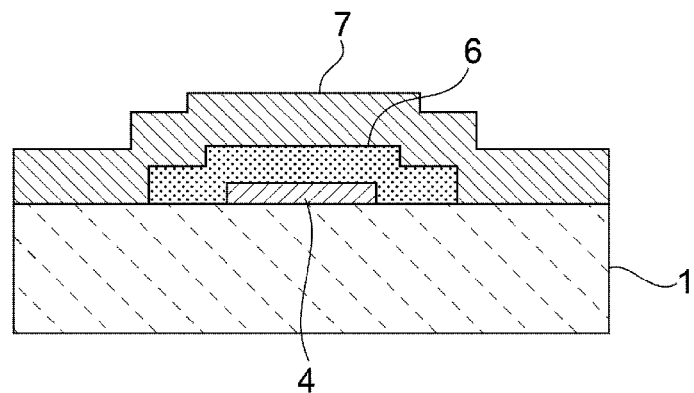
FIG. 2B is a cross-sectional view that corresponds to a portion taken along a line B1-B1 shown in FIG. 2A.

Subsequently, as shown in FIGS. 2A and 2B, a second wiring electrode 7 is so formed as to extend onto the insulation films 5 and 6. As shown in FIG. 2B, the second wiring electrode 7 and the first wiring electrode 4 which is located under the second wiring electrode 7, cross each other in a three-dimensional manner so as to form the three-dimensional crossing section in a region where the insulation films 5 and 6 are provided.

The second wiring electrode 7 can be formed of the same metal material as that of the first wiring electrode 4. The second wiring electrode 7 can be formed as well using the photolithography technique.

Figure 3A:
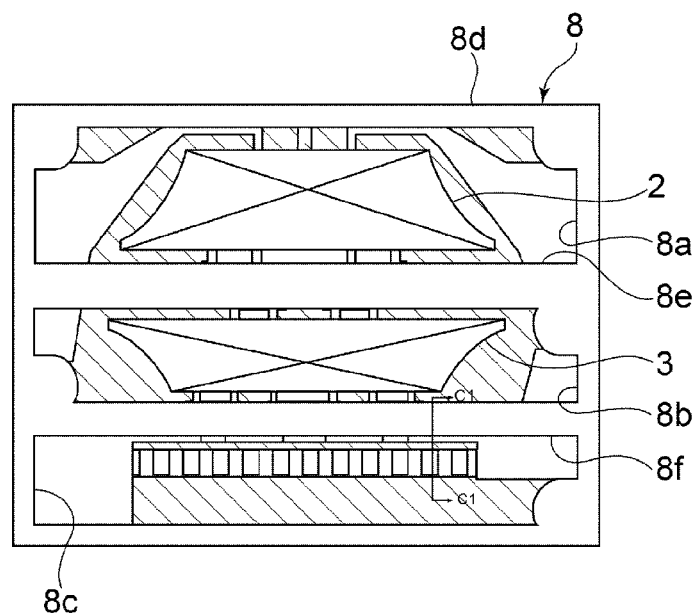
FIG. 3A is a schematic plan view illustrating a state in which a support member is formed on a structure shown in FIG. 2A.
Figure 3B:
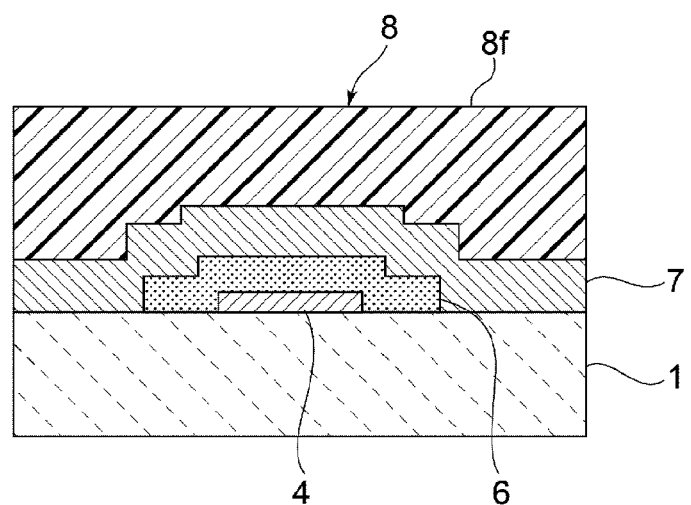
FIG. 3B is an enlarged cross-sectional view of a principal portion thereof.

Thereafter, a support member 8 is formed as shown in FIGS. 3A and 3B. In the present preferred embodiment, the support member 8 is preferably provided so as to have openings 8a and 8b that surround the functional electrode units 2 and 3, respectively. To be more specific, there are provided the opening 8a at the inside of which the functional electrode unit 2 is located, the opening 8b at the inside of which the functional electrode unit 3 is located, and an opening 8c at the inside of which other wiring electrode portions are located. The support member 8 includes an outer circumference portion 8d having a rectangular or substantially rectangular frame shape and partition walls 8e, 8f provided at the inner side of the outer circumference portion 8d so as to form the openings 8a through 8c. The partition wall 8e is provided in a principal surface region of the piezoelectric substrate where the two functional electrode units 2 and 3 oppose each other.

Further, the support member 8 is extended onto the three-dimensional crossing section. In other words, in FIG. 3B, the three-dimensional crossing section is a region where these wiring electrodes overlap with each other when the principal surface of the piezoelectric substrate 1 is viewed from above, and the insulation film 6 which makes contact with the second wiring electrode 7 is provided in the three-dimensional crossing section. The partition wall 8f of the support member 8 is laminated on the second wiring electrode 7.

As shown in FIG. 2A, a width direction length of the second wiring electrode 7 in the three-dimensional crossing section is less than a length of the insulation film 6 in the same direction as that of the above width direction length. Here, the width direction length of the second wiring electrode 7 refers to a width length in a direction orthogonal to a direction in which the second wiring electrode 7 extends in the three-dimensional crossing section.

In the three-dimensional crossing section, a portion in the vicinity of either end of the insulation film 6 in the width direction is not covered by the second wiring electrode 7 and is exposed. Accordingly, the support member 8 is provided so as to cover not only the second wiring electrode 7 but also the exposed portion in the vicinity of either end of the insulation film 6 in the width direction. With this, the insulation film 6 and the support member 8 make direct contact with the second wiring electrode 7 so as to seal the second wiring electrode 7 with certainty in the three-dimensional crossing section. This makes it possible to electrically insulate the second wiring electrode 7 from the first wiring electrode 4 with certainty in the three-dimensional crossing section as well as to surely prevent the second wiring electrode 7 and other portions from being short-circuited.

Note that, however, the support member 8 may be formed, in the three-dimensional crossing section, so as to extend to both ends of the second wiring electrode 7 in the width direction.

In the present preferred embodiment, the support member 8 preferably is formed of the same material as that of the insulation films 5 and 6. In other words, in the present preferred embodiment, the support member 8 preferably is formed of a cured light curing polyimide. In forming the support member 8, light curing polyimide is applied, patterned by the photolithography technique, and cured. Accordingly, the support member 8 and the insulation films 5, 6 can be formed using the same type of process and using the same material. This makes it possible to simplify the manufacturing process and realize cost reduction.

The support member 8, along with a cover member which will be explained later, defines a hollow space at the inside of which the functional electrode units 2 and 3 are provided. Accordingly, the thickness of the support member 8 is considerably larger than that of the insulation films 5 and 6. In the present preferred embodiment, the thickness of each of the insulation films 5 and 6 is a few μm, for example. This is because it is sufficient for the insulation films 5 and 6 to electrically insulate the upper and lower wiring electrodes 4 and 7 from each other.

In contrast, because the support member 8 is a member configured to define the above-mentioned hollow space, the thickness thereof is no less than about 10 μm, normally, about 15 μm to about 20 μm. Although the thickness of the support member 8 is relatively large, the insulation films 5, 6 and the support member 8 can be formed using the same light curing polyimide according to the present preferred embodiment.

As shown in FIG. 3A, in the present preferred embodiment, the partition walls 8e and 8f each preferably extend in parallel or substantially in parallel to one side of the outer circumference portion 8d of the support member 8 having a rectangular or substantially rectangular shape. Accordingly, the partition wall 8e and the partition wall 8f are parallel or substantially parallel to each other. Note that, however, the partition walls 8e and 8f need not be parallel or substantially parallel to each other.

In the present preferred embodiment, the functional electrode unit 2 and the functional electrode unit 3 are located within the opening 8*a* and the opening 8*b*, respectively. As such, because the partition wall 8*e* is provided, the cover member is supported by the support member 8 and the partition wall 8*e*. The strength of the hollow space structure can be enhanced by the partition wall 8*e* disposed in the three-dimensional crossing section.

In a case where the partition walls 8*e* and 8*f* are not provided, when an external force is applied from above to the cover member which will be explained later in detail, the cover member bends toward the piezoelectric substrate side so as to raise a risk that the hollow space structure can be broken.

As opposed to this, in the present preferred embodiment, because the respective areas of the openings 8*a* and 8*b* are relatively small, such a crushing or damaging of the hollow space structure is unlikely to occur. Accordingly, it is preferable for the support member 8 to be formed so as to have one or more partition walls configured to define a plurality of openings. Taking the principal surface of the piezoelectric substrate as a base surface of thickness, the thickness of the partition wall 8*e* may be set smaller than the thickness of the support member 8 and set larger than the thickness of the insulation film. In this case, when the cover member bends toward the piezoelectric substrate side due to action of the outer force, a bending portion of the cover member makes contact with an upper portion of the partition wall 8*e*, but does not make contact with the insulation film and the wiring electrode formed on the insulation film; alternatively, a contact force with respect to the insulation film and the wiring formed on the insulation film is able to be reduced. With this, interference of the cover member with the wiring electrode or the insulation film is reduced.

Figure 4:
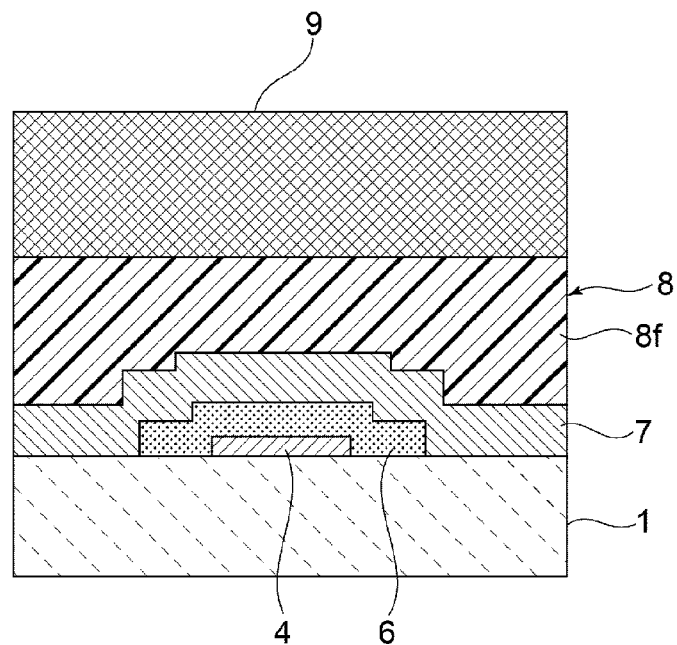
FIG. 4 is a cross-sectional view of a portion where a cover member is formed in the surface acoustic wave device according to the first preferred embodiment of the present invention.

Next, after having formed the support member 8, the cover member is attached so as to seal the openings 8*a* through 8*c*. FIG. 4 is a cross-sectional view of a portion illustrated in FIG. 3B after a cover member 9 has been attached, where the cover member 9 is laminated on the support member 8. The cover member 9 can be formed of an appropriate member such as a synthetic resin plate, a metal plate, a piezoelectric plate, or the like.

Figure 5:
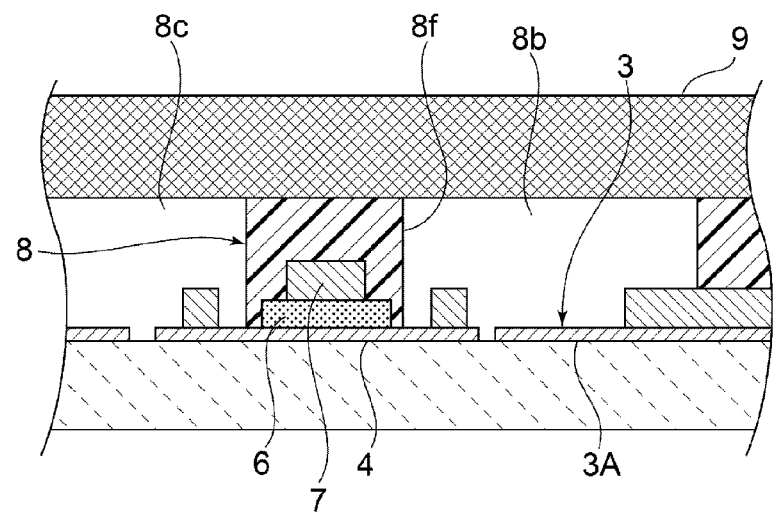
FIG. 5 is a cross-sectional view that corresponds to a line C1-C1 shown in FIG. 3A after the cover member having been provided, in other words, a cross-sectional view of a portion where the support member is provided on a three-dimensional crossing section in the surface acoustic wave device according to the first preferred embodiment of the present invention.

FIG. 5 is a cross-sectional view of a portion taken along a line C1-C1 in FIG. 3A after the cover member 9 has been laminated. FIG. 5 is a partially cutout cross-sectional view illustrating a principal portion of the three-dimensional crossing section provided inside the partition wall 8*f* of the support member 8 and the functional electrode unit 3 including an IDT electrode 3A, in a region of the surface acoustic wave device of the present preferred embodiment where the openings 8*b* and 8*c* are formed. As shown in FIG. 5, the functional electrode unit 3 including the IDT electrode 3A is located inside a hollow space defined by the opening 8*b*.

Further, the partition wall 8*f* of the support member 8 defines the hollow space formed with the opening 8*b* and a hollow space formed with the opening 8*c*.

The cover member 9 can be fixed with an appropriate method such as a method using an adhesive, a method using welding, or the like.

As shown in FIG. 5, in the present preferred embodiment, the support member 8 is present above at least a portion of the second wiring electrode 7 in the three-dimensional crossing section.

As described above, according to the manufacturing method for the surface acoustic wave device of the present preferred embodiment and the surface acoustic wave device thereof, the insulation films 5, 6 defining the three-dimensional crossing section and the support member 8 including the hollow space structure, can be made of the same material and formed using the same method. This makes it possible to simplify the manufacturing process and realize the cost reduction.

Figure 6:
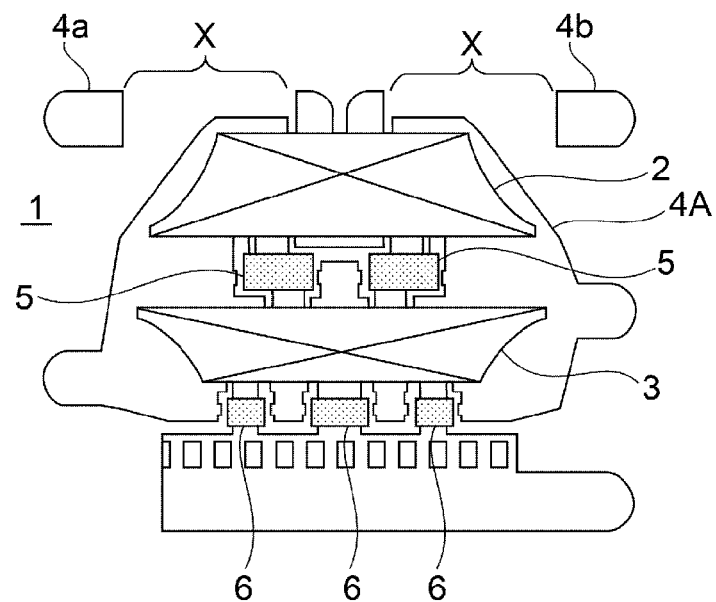
FIG. 6 is a schematic plan view for explaining a manufacturing method for a surface acoustic wave device according to a second preferred embodiment of the present invention.
Figure 7:
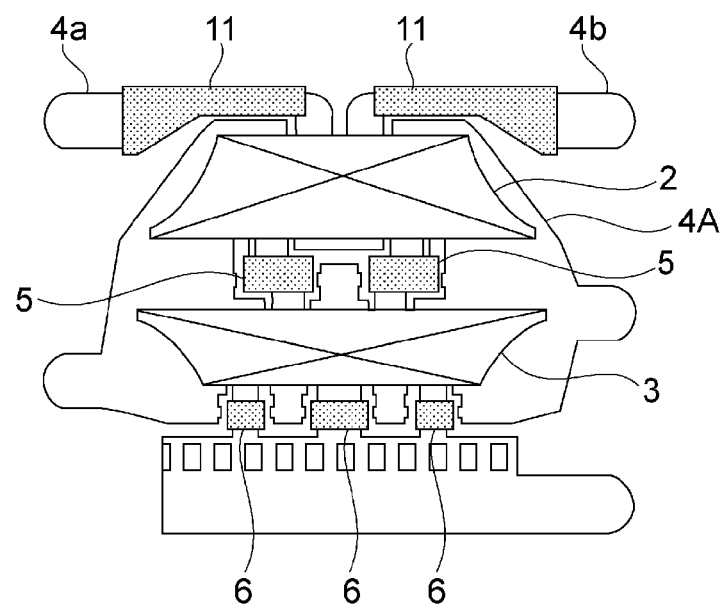
FIG. 7 is a schematic plan view illustrating a state in which an insulation film is formed in the second preferred embodiment of the present invention.
Figure 8:
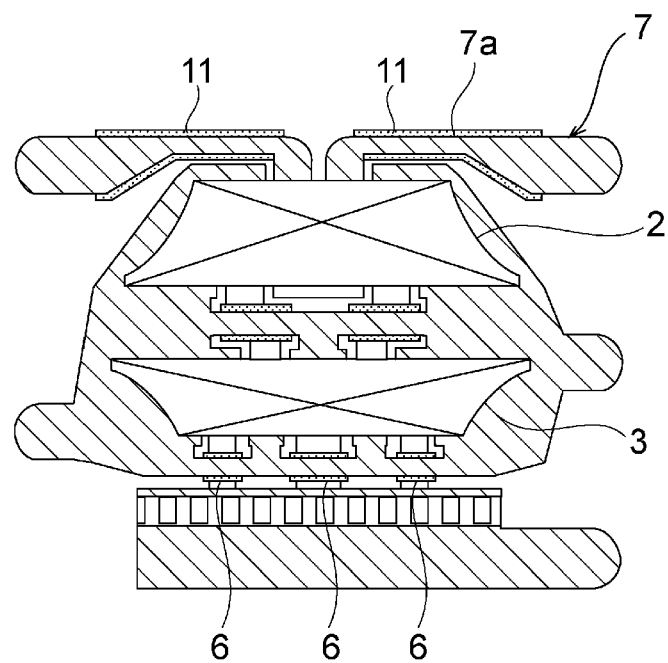
FIG. 8 is a schematic plan view illustrating a state in which a wiring electrode is formed so as to extend onto the insulation film in the second preferred embodiment of the present invention.

In the above-described first preferred embodiment, the insulation films 5 and 6 preferably are provided in the three-dimensional crossing section of the first wiring electrode 4 and the second wiring electrode 7. However, in various preferred embodiments of the present invention, the insulation films may be provided in a region other than the three-dimensional crossing section. FIGS. 6 through 8 are schematic plan views for explaining a manufacturing method and a surface acoustic wave device according to a second preferred embodiment of the present invention mentioned above. First, an electrode structure as shown in FIG. 6 is formed. This electrode structure, like in the first preferred embodiment, includes the functional electrode units 2, 3 and a first wiring electrode 4A. The first wiring electrode 4A includes terminal electrodes 4*a*, 4*b* and the other portions of the first wiring electrode. This structure differs from the structure of the first preferred embodiment in that the terminal electrodes 4*a* and 4*b* of the first wiring electrode 4A are separated from the other portions of the first wiring electrode.

Next, as shown in FIG. 7, the insulation films 5, 6 and a different insulation film 11 are formed. This different insulation film 11 is not provided in a three-dimensional crossing section and defines a laminated portion which will be explained later. The insulation film 11 is provided so that the terminal electrodes 4*a* and 4*b* are able to be connected to wiring electrode portions to which these terminal electrodes are intended to be finally connected. Specifically, a non-formation area where wiring is not formed is provided on a portion of the first wiring electrode 4 shown in FIG. 1A. As shown in FIG. 6, the non-formation area is so provided as to include a portion of the first wiring electrode 4 where the line width thereof is smaller. As shown in FIG. 7, the different insulation film 11 is provided on the principal surface of the piezoelectric substrate so as to overlap with the non-formation area of the first wiring electrode 4 when the principal surface of the piezoelectric substrate is viewed from above. The different insulation film 11 and the insulation films 5, 6 can be formed of the same material in the same process. In the present preferred embodiment, the insulation films 5, 6 and the different insulation film 11 preferably are formed of the same material in the same process.

Subsequently, as shown in FIG. 8, the second wiring electrode 7 is formed. In various preferred embodiments of the present invention, the second wiring electrode 7 is preferably laminated on the insulation film 11 so as to form the laminated portion. The second wiring electrode 7 is provided so as to extend onto the terminal electrodes 4*a*, 4*b* and the insulation film 11. As such, the terminal electrodes 4*a*, 4*b* that have been separated from the other portions of the first wiring electrode as shown in FIG. 6 are made to be electrically connected to the other portions of the first wiring electrode by the second wiring electrode 7. With this, the terminal electrodes 4*a* and 4*b* are electrically connected to the IDT electrode. The region where the insulation film 11 is provided is not a region where the upper and lower wiring electrodes cross each other in a three-dimensional manner; however, the insulation film 11 may be formed in a region other than the three-dimensional crossing section.

Further, in the laminated portion, there is provided a portion 7*a* where the width of the second wiring electrode 7 is smaller than the width of the other portion of the second wiring electrode 7 in the laminated portion.

Providing the second wiring electrode 7 on the upper surface of the insulation film 11 formed of the same material as that of the support member 8 makes it easy to form a film whose coefficient of linear expansion and coefficient of elasticity are different from those of the piezoelectric substrate 1 under the second wiring electrode 7 or to form a second wiring electrode 7 having a different height from the principal surface of the piezoelectric substrate 1.

In the second preferred embodiment, like in the first preferred embodiment, it is sufficient to subsequently form the support member 8 using the same material as that of the insulation films 5, 6, and 11, and then attach a cover member. In the manner described above, the surface acoustic wave device according to the second preferred embodiment of the present invention preferably is obtained.

Figure 9:
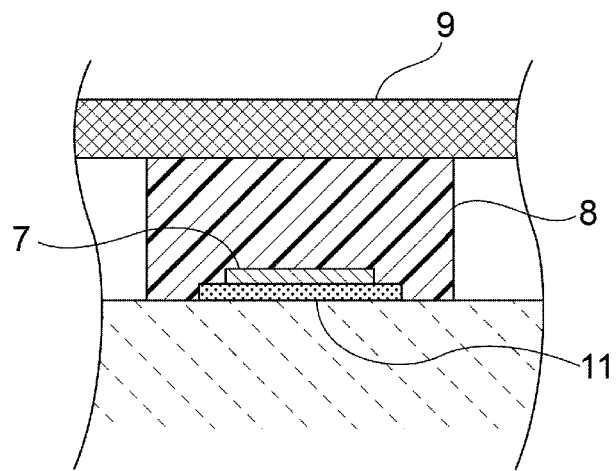
FIG. 9 is a traverse cross-sectional view illustrating a structure where a laminated portion is provided inside a support member.

As shown in FIG. 9, it is preferable for the above-mentioned laminated portion to be provided inside the support member 8. This makes it possible for the support member 8 to seal the second wiring electrode 7 in the laminated portion.

Like in FIG. 3A, the outer circumference portion 8d of the support member 8 is formed so as to cover the second wiring electrode 7 that is provided on the upper surface of the insulation film 11. By disposing a portion of the wiring in a region of the piezoelectric substrate where the outer circumference portion 8d of the support member 8 is provided, an area where functional units can be disposed in the hollow space of the piezoelectric substrate is enlarged. Further, by covering the periphery of the second wiring electrode 7 disposed inside the support member 8 with the same material, it is possible to reduce stress that is applied to the second wiring electrode 7 due to difference in thermal expansion generated in a reflow process or the like. This is particularly effective in a configuration that includes, in the non-formation area, wiring which is narrow in line width and weak in strength.

The insulation films 5, 6, and 11 preferably are formed to have a different thickness from that of the support member. In other words, the support member is formed to have a larger thickness. Although the support member is formed to have a larger thickness, the insulation layers 5, 6, and 11 and a partition member can be formed using the same material and using the same deposition technique. This makes it possible to simplify the manufacturing method and realize the cost reduction. Further, using the same material for the insulation films and the support member makes it possible to suppress or prevent the generation of stress due to difference in coefficients of linear expansion when experiencing a temperature change. Furthermore, covering the three-dimensional crossing section with the support member makes it possible to suppress or prevent problems such that the strength of the first and second wiring electrodes is lowered due to oxidation caused by the external atmosphere, and so on.

Various preferred embodiments of the present invention can be widely applied to surface acoustic wave devices in which a support member is formed on a piezoelectric substrate and a hollow space is formed by attaching a cover member so as to close openings of the support member. Accordingly, as described before, the mode or application of the electrode in the functional electrode unit is not limited to any specific one. The form of patterning of the wiring electrode is also not limited to any specific one.

Note that a wiring electrode having a three-dimensional crossing section can be designed to have a higher density and become smaller in size. Further, in various preferred embodiments of the present invention, insulation films necessary to provide the three-dimensional crossing section can be formed using the same material and the same manufacturing method as those of a support member. Accordingly, various preferred embodiments of the present invention can be preferably applied to a surface acoustic wave device including such wires that cross each other in a three-dimensional manner.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a substrate;
   a functional electrode unit located on the substrate and including at least one interdigital transducer (IDT) electrode;
   a wiring electrode that is connected to the functional electrode unit and is located on the substrate;
   an insulation film that is provided between a portion of the wiring electrode and the substrate;
   a support member that is provided on the substrate and surrounds the functional electrode unit and at least a portion of the wiring electrode; and
   a cover member that defines, along with the support member, a hollow space in which the functional electrode unit is located; wherein
   a thickness of the support member is larger than a thickness of the insulation film, and the insulation film and the support member are made of the same material;
   the wiring electrode includes a first wiring electrode and a second wiring electrode;
   a three-dimensional crossing section where the first wiring electrode and the second wiring electrode cross each other in a three-dimensional manner is provided;
   the support member is present above at least a portion of the second wiring electrode in the three-dimensional crossing section;
   the insulation film is located under the second wiring electrode in the three-dimensional crossing section; and
   the first wiring electrode is located under the insulation film.

2. The surface acoustic wave device according to claim 1, wherein the three-dimensional crossing section is provided at an inside of the support member.

3. The surface acoustic wave device according to claim 2, wherein in the three-dimensional crossing section provided at an inside of the support member, the second wiring electrode includes a portion where a width of the second wiring electrode is smaller than a width of another portion of the second wiring electrode inside the three-dimensional crossing section.

4. The surface acoustic wave device according to claim 1, wherein a laminated portion where the second wiring electrode and another insulation film are layered is provided at an inside of the support member when the substrate is viewed from above.

5. The surface acoustic wave device according to claim 4, wherein in the laminated portion provided at the inside of the support member, the second wiring electrode includes a portion where a width of the second wiring electrode is smaller than a width of another portion of the second wiring electrode inside the laminated portion.

6. The surface acoustic wave device according to claim 1, wherein the insulation film and the support member are made of synthetic resin.

7. The surface acoustic wave device according to claim 6, wherein the synthetic resin is a cured light curing polyimide.

8. The surface acoustic wave device according to claim 6, wherein the synthetic resin is a cured thermosetting polyimide.

9. The surface acoustic wave device according to claim 1, wherein the IDT electrode includes an AlCu epitaxial film.

10. The surface acoustic wave device according to claim 1, wherein the functional electrode unit includes the IDT electrode and reflector electrodes disposed at both sides of the IDT electrode.

11. The surface acoustic wave device according to claim 1, wherein the functional electrode unit is a first functional electrode unit, and a second functional electrode unit provided on the substrate.

12. The surface acoustic wave device according to claim 11, wherein the first and second functional electrode units are connected to define a balanced surface acoustic wave filter.

13. The surface acoustic wave device according to claim 11, wherein the first and second functional electrode units are connected to define an unbalanced surface acoustic wave filter.

14. The surface acoustic wave device according to claim 11, wherein the support member includes openings that each surrounds a respective one of the first and second functional electrode units.

15. The surface acoustic wave device according to claim 1, wherein the wiring electrode and the functional electrode unit are made with a laminated metal film.

16. The surface acoustic wave device according to claim 1, wherein the support member includes an opening that surrounds the functional electrode unit.

17. The surface acoustic wave device according to claim 1, wherein the insulation film is a first insulation film, and a second insulation film is provided in another three-dimensional crossing section.

18. The surface acoustic wave device according to claim 17, wherein the first and second insulation films are made of a same material.

19. The surface acoustic wave device according to claim 17, wherein a third insulation film is provided on the substrate at a location where the first wiring electrode is not disposed.

* * * * *